(12) United States Patent
Ackermann et al.

(10) Patent No.: US 9,683,759 B2
(45) Date of Patent: Jun. 20, 2017

(54) VERY EFFICIENT HEAT EXCHANGER FOR CRYOGEN FREE MRI MAGNET

(71) Applicant: KONINKLIJKE PHILIPS N.V., Eindhoven (NL)

(72) Inventors: Robert Adolph Ackermann, Latham, NY (US); Philippe Menteur, Latham, NY (US); Manmohan Dhar, Latham, NY (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 365 days.

(21) Appl. No.: 14/347,526

(22) PCT Filed: Sep. 26, 2012

(86) PCT No.: PCT/IB2012/055119
§ 371 (c)(1),
(2) Date: Mar. 26, 2014

(87) PCT Pub. No.: WO2013/046129
PCT Pub. Date: Apr. 4, 2013

(65) Prior Publication Data
US 2014/0243205 A1    Aug. 28, 2014

Related U.S. Application Data

(60) Provisional application No. 61/540,114, filed on Sep. 28, 2011.

(51) Int. Cl.
*F25B 9/00* (2006.01)
*F25B 25/00* (2006.01)
(Continued)

(52) U.S. Cl.
CPC ............ *F25B 9/002* (2013.01); *F25B 25/005* (2013.01); *F25D 19/00* (2013.01); *G01R 33/035* (2013.01);
(Continued)

(58) Field of Classification Search
CPC ............ F28D 7/02; F28D 7/022; F17C 3/085; G01R 33/035; G01R 33/3815
(Continued)

(56) References Cited

U.S. PATENT DOCUMENTS 2,883,591 A * 4/1959 Camp .................... F28D 15/02
165/104.19
3,672,181 A * 6/1972 Tyree, Jr. ................ F25D 3/127
62/380

(Continued)

FOREIGN PATENT DOCUMENTS

| EP | 1643197 A2 | 4/2006 |
| JP | 0296304 A | 4/1990 |
| WO | 2011080630 A2 | 7/2011 |

*Primary Examiner* — Brian King

(57) ABSTRACT

A heat exchanger (5) includes a thermally conductive cylindrical container (40), at least one thermally conductive tube (30), a cooling column (90), and a cryogen coldhead (100). The cooling column and coldhead condense gaseous helium to liquid helium to maintain a reservoir of liquid helium in the thermally conductive cylindrical container (40). The at least one thermally conductive tube (30) coils circumferentially around the container (40), and extends to at least one superconducting magnet coil heat exchanger (20), and back. The tube forms a selected loop which holds gaseous helium at pressure up about 104 bar (1500 PSI) or room temperature to about 0.75 bar at cryogenic temperatures.

20 Claims, 4 Drawing Sheets

(51) Int. Cl.
*F25D 19/00* (2006.01)
*G01R 33/38* (2006.01)
*G01R 33/3815* (2006.01)
*H01F 6/04* (2006.01)
*G01R 33/035* (2006.01)
*F25B 9/10* (2006.01)

(52) U.S. Cl.
CPC ..... *G01R 33/3804* (2013.01); *G01R 33/3815* (2013.01); *H01F 6/04* (2013.01); *F25B 9/10* (2013.01)

(58) Field of Classification Search
USPC .......................................................... 62/51.1
See application file for complete search history.

(56) References Cited

U.S. PATENT DOCUMENTS

| | | | |
|---|---|---|---|
| 3,978,681 A * | 9/1976 | Kjelgaard | A01C 23/024 111/119 |
| 5,583,472 A | 12/1996 | Moritsu | |
| 5,918,470 A * | 7/1999 | Xu | F25D 19/006 335/216 |
| 6,144,274 A | 11/2000 | Bischke | |
| 6,389,821 B2 | 5/2002 | Strobel | |
| 6,609,383 B1 | 8/2003 | Kusada | |
| 7,305,845 B2 * | 12/2007 | Mangano | G01R 33/3815 335/300 |
| 9,074,798 B2 | 7/2015 | Ackermann et al. | |
| 2006/0048522 A1 * | 3/2006 | Yamada | F25B 25/005 62/6 |
| 2006/0097146 A1 | 5/2006 | Strobel | |
| 2007/0245749 A1 * | 10/2007 | Atkins | F25B 9/00 62/51.1 |
| 2008/0209919 A1 * | 9/2008 | Ackermann | F25B 25/005 62/51.1 |
| 2008/0289357 A1 * | 11/2008 | Skobel | A23G 9/045 62/386 |
| 2012/0096873 A1 * | 4/2012 | Webber | F25D 19/006 62/48.1 |
| 2013/0023418 A1 | 1/2013 | Ackermann et al. | |

* cited by examiner

VERY EFFICIENT HEAT EXCHANGER FOR CRYOGEN FREE MRI MAGNET

CROSS-REFERENCE TO PRIOR APPLICATIONS

This application is the U.S. National Phase application under 35 U.S.C. §371 of International Application No. PCT/IB2012/055119, filed on Sep. 26, 2012, which claims the benefit of U.S. Provisional Patent Application No. 61/540,114, filed on Sep. 28, 2011. These applications are hereby incorporated by reference herein.

The present application relates to the cooling of superconducting magnets, and specifically to heat exchangers and the like.

Magnetic resonance (MR) scanners use superconducting magnets, which are cooled to a superconducting temperature, e.g. less than 5.2° Kelvin. Traditionally liquid helium has been used to cool superconductive magnets because of its thermal properties. However, liquid helium is expensive. Many areas of the world do not have a ready supply of liquid helium or replacement liquid helium.

Typically superconducting magnets are bathed in liquid helium which as it cools the magnet changes from a liquid to a gas. The gas is then re-condensed and/or cooled to a liquid state by a refrigerator or heat exchanger before re-circulating back to the magnet. Alternatives to using liquid helium require an efficient method of heat exchange in order to keep the coolant and in turn the magnet below the critical temperature. Physical space also places limitations on the size and placement of the cooling apparatus.

There are also operational complexities in the start-up of the system. A room temperature of 21° C. is approximately 294° K, while the normal operating temperature of the superconducting magnet is typically below 4.8° K. Any device or method employed must accommodate a start-up of the system from normal room temperatures down to superconducting temperatures. This change in temperature may involve a change in pressure. A magnet quench causes the magnet temperature to rise above 70° K. During a quench or another resulting rise in temperature, costly coolant may be lost as the coolant expands with the temperature increases before the system can be re-cooled. Escaping helium can displace oxygen in the magnet room causing potential health risks to persons adjacent to the magnet.

The present application provides a new and improved efficient heat exchanger for a cryogen free MR magnet which overcomes the above-referenced problems and others.

In accordance with one aspect, a heat exchanger includes a thermally conductive cylindrical container, at least one thermally conductive tube, a cooling column, and a cryogen coldhead. The thermally conductive cylindrical container contains helium. The at least one thermally conductive tube (30) coils circumferentially around the container, connects in a closed loop to at least one superconducting magnet coil heat exchanger, and contains gaseous helium. The cooling column connects to the thermally conductive cylindrical container to receive helium gas therefrom and supply liquid helium thereto. The cryogen coldhead is mounted to the cooling column and condenses helium gas in the cooling column into cold liquid helium.

In accordance with another aspect, a method of cooling a superconducting magnet circulates gaseous helium in a closed loop of thermally conductive tubing which circulates through a thermal siphon action. Heat transfers from the superconducting magnet to circulating gaseous helium in a lower portion of the closed loop of thermal conductive tubing. Heat transfers from the circulating gaseous helium in an upper portion of the close loop of thermally conductive tubing via a system heat exchanger to liquid helium. Gaseous helium recondenses from the system heat exchanger in a cooling column using a cryogen coldhead and returns the condensed helium to the system heat exchanger.

One advantage is that helium which is circulated to the MR magnet and between the coil heat exchanger and the system heat exchanger is in a single gaseous phase.

Another advantage is that the helium circulated to the MR magnet is in a closed system, which prevents loss during start-up or a quench.

Another advantage is the system holds helium in high pressure at room temperature.

Another advantage is that the system is fully passive requiring no external intervention during all cooling modes: cooldown, quench and normal operation.

Another advantage is that the system has low flow friction losses which are easily fabricated with hermetically sealed joints.

Another advantage is that the heat exchanger accommodates a simple start-up process from room temperature.

Another advantage is that the heat exchanger has no moving parts.

Another advantage is that the heat exchanger is compact and transfers heat very efficiently.

Another advantage is that the system has a large heat transfer area with a wound tube on a highly conductive element.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

Figure 1:
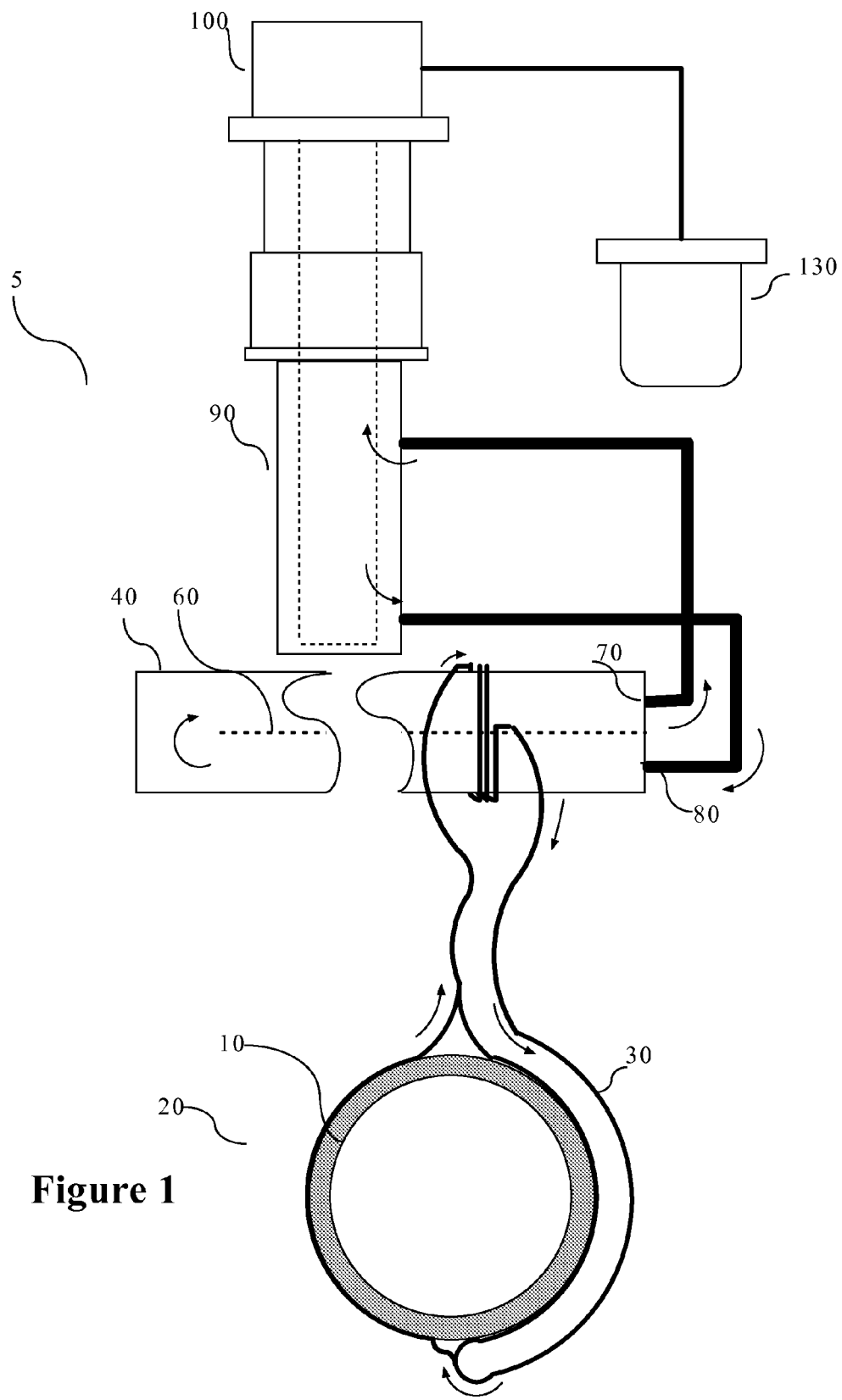
FIG. 1 is schematic of one embodiment of the heat exchanger in a magnet system.

With reference to FIG. 1, one embodiment of the heat exchanger 5 in a system is shown. A magnet coil 10 during operation generates heat. The heat is efficiently transferred away from the magnet coil 10 to circulating helium vapor through an efficient coil heat exchanger 20 in a thermosiphon circuit. The helium vapor circulates between the coil heat exchanger 20 and the system heat exchanger 5 in tubing 30. The tubing 30 is a hermetically sealed closed loop system. At one end of the loop, advantageously a lower end, the tubing and the gaseous helium absorbs heat from the magnet 10 via the coil heat exchanger 20. At the other end of the loop, advantageously the upper end, the gaseous helium loses the heat via the system heat exchanger 5 to liquid helium contained within. The tubing 30 wraps around a thermally conductive sleeve or container 40 of the heat exchanger 5. In the illustrated embodiment, denser cold helium gas flows by gravity from the system heat exchanger to the coil heat exchanger where it is warmed. The warm gas, being less dense, rises to the system heat exchanger where it is cooled.

The thermally conductive container 40 in contact with the wound tubing 30 provides enough surface area to transfers the heat from the warm circulating helium vapor to the liquid helium inside the container 40. The transfer cools the helium vapor to re-circulate to and cool the coil components. As the helium warms inside the container 40, the helium rises above a septum or baffle plate 60. The baffle plate 60 divides the sleeve or cylindrical shape container 40. The upper portion of the sleeve or container 40 is connected to an outflow 70, and the lower portion is connected to an inflow 80. As the helium warms in the container 40 it rises and flows out the outflow to a cooling column 90. In one embodiment the cooling column includes a $1^{st}$ stage coldhead, wetsock, and a $2^{nd}$ stage coldhead. As the warm helium gas rises in the cooling column 90, it encounters the cryogen coldhead 100, wet sock, or other stage coldhead which cools the helium. As the helium cools it condenses into a cool denser liquid. The cool denser liquid sinks to the bottom of the column. The cool denser liquid flows with gravity out the bottom of the cooling column 90 and returns to the inflow 80 of the container 40. The cool liquid helium flows around the bottom of the sleeve or container 40 and begins the process again of absorbing heat from the helium vapor circulating in the tubing 30. The coldhead 100 will cool liquid helium to approximately 4.2° K.

Helium vapor is sealed in the tubing 30 under pressure. In the embodiment, helium gas at critical temperature exerts 0.75-0.83 bar (11-12 PSI) while the same volume of helium at room temperature exerts 68-105 bar (1000-1500 PSI). The tubing 30 which is thermally efficient in heat transfer also maintains the pressure 68-102 atmospheres of helium at room temperature such that when cooled to 4.5° K it flows at 75-0.83 bar in a siphoning action. The helium vapor flows in the tubing to the bottom of the magnet coil heat exchanger 20, around the container 40 of the system heat exchanger 50 not defined, and back to the magnet component 20. As the helium cools, the helium contracts, and creates a siphoning action. No moving parts are involved. A minimum of temperature difference is required. The tubing 30 is hermetically sealed for the useful life of the MR magnet once helium vapor is placed in the tube 30. Stainless steel is example material used for the tubing 30 which provides strength under pressure and efficient heat transfer. The tubing can be one piece or can start out as separate sections in the system heat exchanger, the coil heat exchanger, and connecting tubing for simplicity of manufacture.

The container or sleeve 40 contains helium in both a gaseous and a liquid state. During initial start-up, the magnet assembly can be initially cooled to about 70° K with a nitrogen cooling system (not shown). The coldhead 100 is hermetically sealed with the cooling column 90. The cooling column 90 and container 40 initially contain only gaseous helium. As the coldhead 100 cools the gaseous helium, the helium contracts, and more helium is introduced into the system from a helium expansion tank 130. As the helium cools and becomes denser, it sinks to the bottom of the cooling column 90 and flows into inflow 80 of the container 40 and into the bottom of the container 40. Once the cooler, denser helium enters the container 40, it cools the container 40 and begins to cool the vapor in the tubing 30. As the helium cools the heat exchanger 5, the helium absorbs the heat, expands and rises to the top of the container 40. Once the warmer, less dense helium rises to the top of the container 40, it flows out the outflow 70 and back to the cooling column 90. Once in the cooling column 90, it rises and encounters the cryogen coldhead 100 and begins the process anew. As the helium is re-circulated between the container 40 and the cooling column 90 and the coldhead 100, it eventually reaches a liquid state in the lower portion of the column and the system heat exchanger 5. When the magnet components 20 in turn drop in temperature below critical temperature, the magnet can be operated.

The process for re-starting the system following a quench is similar. During a quench, the operating temperature of the magnet rises, e.g. above 70° K. The heating of the helium gas in the coil heat exchanger disrupts the thermosiphon slowing the transfer of heat to the system heat exchanger. The system must be re-cooled before restarting operation. When the temperature begins to rise, and helium expands in the container 40 and cooling column 90, helium transfers to the expansion tank 130 preventing loss. As the system is restarted and the temperature begins to drop, helium is transferred back from the expansion tank 130 and into the cooling column 90. A simple and orderly process of cooling is maintained both during start-up and when a re-start occurs.

Figure 2:
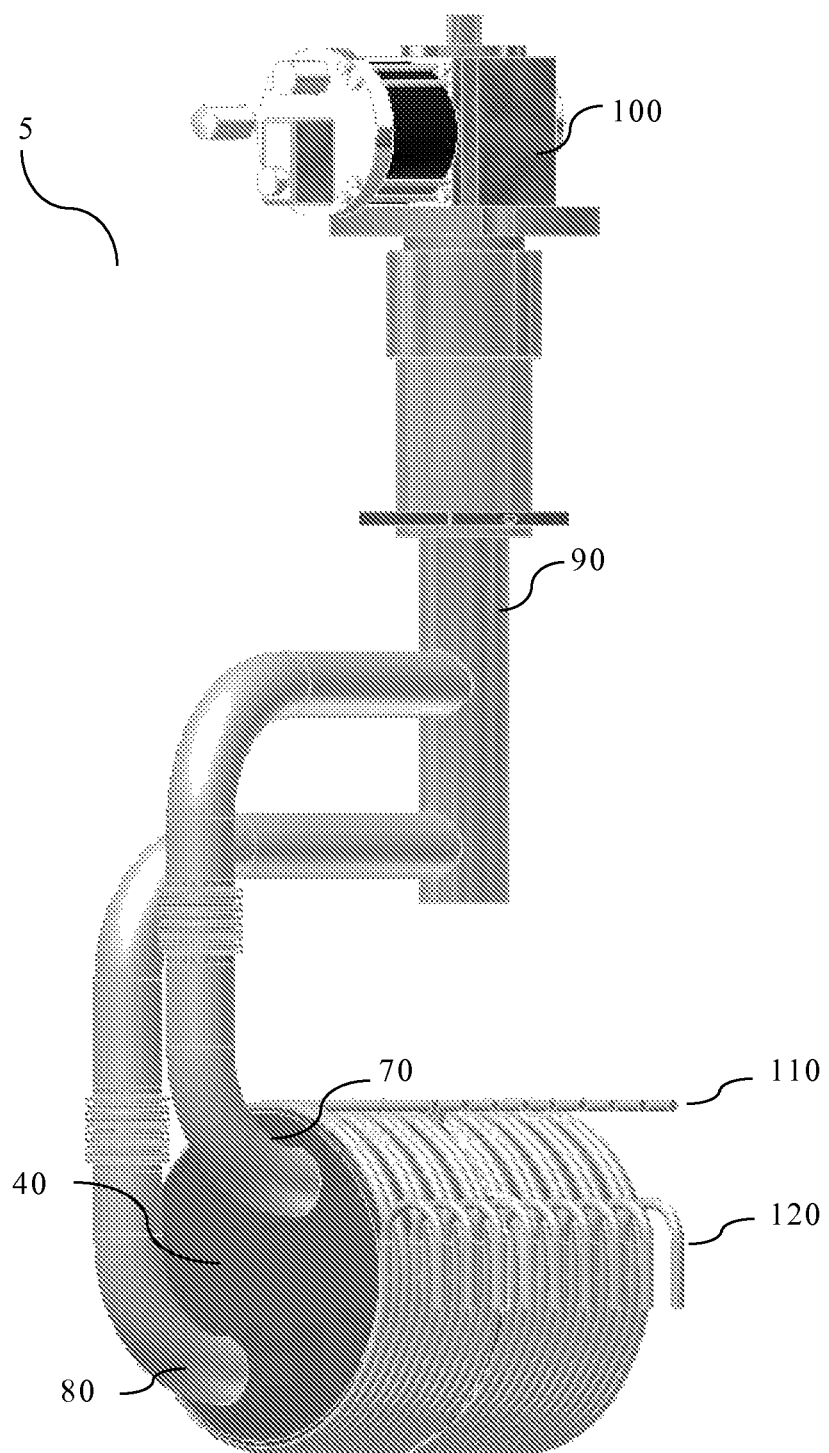
FIG. 2 is perspective view of one embodiment of the heat exchanger.

With reference to FIG. 2, an embodiment of the heat exchanger 5 is shown with nine closed loops of tubing 30 which cool various magnet components. Six loops cool magnet coils 10, two loops cool structural components, and one loop cools electronic and other magnet components. To achieve the surface area for heat transfer each tube 30 is wound about the container 40 approximately 2.75 times from a top connector 110 to a bottom connector 120. The tubing 30 is thermally connected with the container 40 e.g. by brazing. The top tubing coil connector 110 receives the inflow of warmer gaseous helium. The thermally conductive container or sleeve 40 is manufactured from a thermally conductive material such as stainless steel or copper. After the appropriate number of revolutions about the container 40 to cool the gaseous helium, the tubing 30 exits contact with the container at a lower connector 120, lower than the starting point 110 or about 3 o'clock in the illustrated embodiment.

Figure 3:
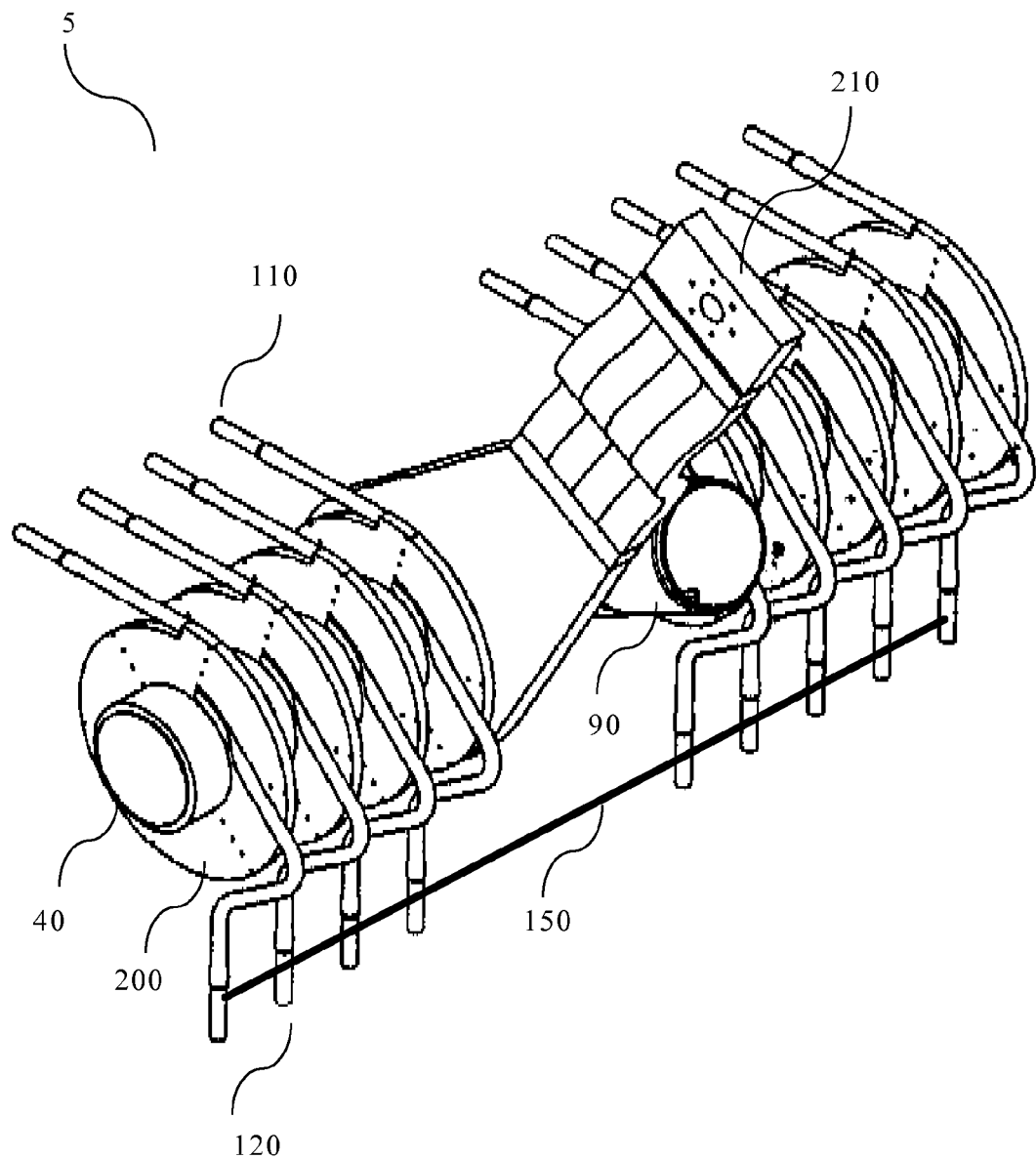
FIG. 3 is perspective view of one embodiment of the heat exchanger sleeve using cooling plates.

With reference to FIG. 3, another embodiment of the system heat exchanger 5 with cooling plates 200 is shown. The thermally conductive plates 200 are attached with a thermally conductive bond to the container 40. A thermally conductive weld such as braze is used for example. The circular plates 200 extend out from the exterior of the container 40 perpendicular to the axis of the container 40. The tubing 30 is affixed in a thermally conductive bond, e.g. brazing to the plate 200. In order to achieve more surface area for heat transfer, the tubing 30 is wrapped concentrically or spirally on the plate 200. The tubing can be brazed or soldered to the plate first and the assembly can be brazed to the container or vice versa. The warm inflow connectors 110 are at the outer most edge and progress in smaller windings about the container 40 with the smallest winding nearest to the surface of the container. The cold return 120 of the tubing 30 exits in a plane offset from the windings of the tubing about the container 40. In the illustrated embodiment, there is one plate 200 for each cooling circuit of tubing 30. The plates 200 are manufactured from a thermally efficient material such as copper or stainless steel. A manifold 150 can be used to equalize pressure between tubing circuits 30.

The cooling column 90 is affixed directly to the sleeve 40 eliminating piping for a separate inflow and outflow. The cooling column 90 is located at the center of the sleeve or container 40. Four tubing 30 circuits, FIG. 1, are located around the container on one side of where the cooling column 90 joins with the container 40 and five on the other side. A mounting bracket 210 is used to mount the heat exchanger 50 to associated structures.

Another embodiment deploys the container 40 in a vertical position. When the container is in a vertical position, plates 200 are mounted horizontally, and no baffle plate is used.

The efficiency of the heat exchanger is defined by the number of net heat transfer units (NTU), and NTU=h A/M C where h is the heat transfer coefficient, A is the heat transfer area inside the tubes, M is the mass flow due to the siphoning action, and C is the heat capacity of the helium vapor. A is a function of the length and diameter of the tube. Thermally conductive materials such as stainless steel, copper, aluminum or the like are contemplated. These heat exchanger embodiments achieve a high NTU in a compact space.

Figure 4:
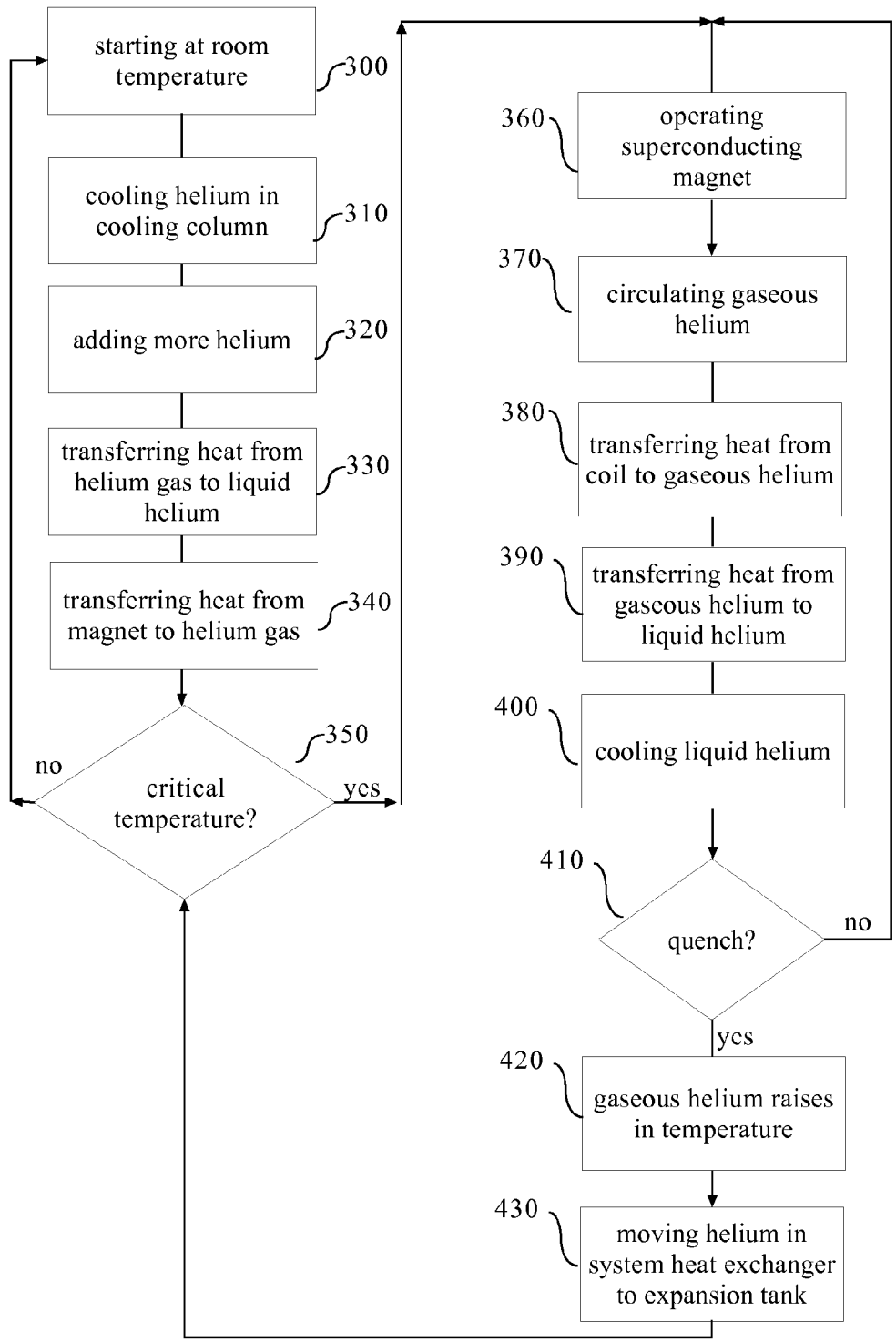
FIG. 4 is a flowchart illustrating system operation.

With reference to FIG. 4, a flowchart illustrates the method of cooling a MR magnet. Beginning at room temperature 300 the magnet is cooled to about 70° K by a nitrogen or other cooling system, as described in U.S. 61/290,270 (WO/2011/080630). The cryogen coldhead 310 cools helium in the cooling column. The helium condenses as it cools and more helium is added 320 to the cooling column. As the helium condenses, it flows into the container 40. Heat transfers 330 from the helium gas in the thermally conductive tubing 30 to the colder helium in the cavity of the container 40. The helium in the tubing contracts as the heat is transferred and causes circulation in the tubing 30 to begin. As circulation continues the colder helium reaches the coil heat exchanger of the magnet. As the colder helium gas circulates around the magnet, heat transfers from the magnet coil to the helium gas 340 via the coil heat exchanger. This process of cooling the magnet continues until the temperature of the magnet drops below the critical temperature.

Once the magnet drops below the critical temperature, the magnet is operated as a superconducting magnet 360. Helium continues to circulate 370 in the tubing through the thermal siphoning action. Heat transfers 380 from the magnet coil to the gaseous helium. The gaseous helium transfers 390 that heat to the liquid helium via the system heat exchanger. The liquid helium warms to a gaseous state and rises in the container and flows into the cooling column. The cryogen coldhead cools and re-condenses the helium to a liquid state 400. The liquid helium drops in the cooling column and flows into the cavity of the container where the cycle repeats.

During a quench 410, the rapid temperature rise of the magnet causes an increase in heat transfer to the circulating helium. The circulating helium in turn will transfer the heat to the liquid helium 420. With a rapid rise in temperature, the helium in the cooling column will expand. The system moves 430 the expanding helium from the cooling column of the system heat exchanger into the expansion tank to prevent loss. The process of re-cooling the magnet to superconductivity is the same as the process for the system start-up 300.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

Having thus described the preferred embodiments, the invention is now claimed to be:

1. A heat exchanger system comprising:
   a first hermetically sealed, passive heat exchanger including:
      a thermally conductive cylindrical container containing helium, the thermally conductive cylindrical container being disposed with a longitudinal axis extending horizontally, the cylinder container including an inflow port in a lower portion of one side and an outflow port at an upper portion;
      a cooling column disposed higher than and hermetically connected to the thermally conductive cylindrical container outflow port to receive helium gas rising therefrom by thermal gradients and to the inflow port to supply liquid helium by gravity thereto;
      a cryogenic coldhead mounted to the cooling column and configured to condense the helium gas in the cooling column into cold liquid helium which falls by gravity to a bottom of the cooling column and flows by gravity to the inflow port of the thermally conductive cylindrical container;
      an expansion tank connected with the coldhead and configured to receive the helium gas from the cooling column in the event of a temperature rise and return the helium gas to the cooling column as the helium cools;
      wherein the first hermetically sealed, passive heat exchanger is sealed against losing or receiving helium and has no moving parts and operates without external intervention during cooldown, quench, and normal operation;
   a second hermetically sealed heat exchanger including:
      one thermally conductive tubing coiled circumferentially around and thermally coupled to the thermally conductive cylindrical container such that gaseous helium in the thermally conductive tubing is cooled by the helium in the thermally conductive cylinder container, the thermally conductive tubing extending in a closed, hermetically sealed loop with a superconducting coil heat exchanger disposed lower than the thermally conductive cylindrical such that the gaseous helium sealed in the thermally conductive tubing forms a thermosiphon which circulates the gaseous helium using thermal gradients without moving parts.

2. The heat exchanger system according to claim 1, wherein the thermally conductive cylindrical container includes:
   a baffle plate disposed horizontally in the container to divide the container into a lower portion which receives the liquid helium from the cooling column via the inflow port and an upper portion which supplies the helium as to the cooling column via the outflow port.

3. The heat exchanger system according to claim 1, wherein the thermally conductive tubing is sealed to retain the gaseous helium at 4.5° K to 295° K at internal pressures up to a least 102 atmospheres.

4. The heat exchanger system according to claim 1, further including:
   a series of thermally conductive disks mounted around an exterior of the thermally conducive cylindrical container wherein a spiral portion of the thermally conductive tubing is supported by and thermally coupled to each disk, such that the tubing is thermally coupled to the thermally conductive cylindrical container via the thermally conductive disks.

5. The heat exchanger system according to claim 1, wherein the gaseous helium enters a portion of the thermally conductive tubing coiled around the thermally conductive container higher than where the gaseous helium leaves the portion of the thermally conductive tubing wound around the container.

6. The heat exchanger system according to claim 1 further including:
   a plurality of thermally conductive plates, each thermally connected to the exterior of the thermally conductive container, extending from the thermally conductive container, and each spaced at intervals along a length of the thermally conductive container, the thermally conductive tubing being coiled around the container in thermal communication with the plates.

7. The heat exchanger system according to claim 1, further including:
a manifold which connects the cooling to loops to provide pressure balance there between.

8. A magnetic resonance magnet system comprising:
a superconducting magnetic resonance magnet;
the heat exchanger system according to claim 1.

9. A method of cooling a superconducting magnet comprising:
starting at room temperature with gaseous helium sealed in a closed loop of thermally conductive tubing at 65-105 bar;
starting at room temperature with gaseous helium hermetically sealed in an interconnected
thermally conductive cylinder around which the closed loop of tubing is wrapped in thermal communication therewith,
a cooling column disposed higher than the thermally conductive cylinder,
a cryogen coldhead adjacent a top of the cooling column, and
an expansion tank connected with the cooling column and the coldhead,
cooling the gaseous helium contained in the cooling column with the cryogen coldhead;
as pressure in the cooling column drops due to the cooling, receiving more helium from the expansion tank and causing the gaseous helium to condense into a liquid state and fall by gravity to a bottom of the cooling column;
allowing the liquid state helium to flow by gravity from the bottom of the cooling cylinder to the thermally conductive container;
transferring heat from the gaseous helium sealed in the closed loop of thermally conductive tubing to the liquid state helium in the thermally conductive container causing some of the liquid state helium to form gaseous helium;
transferring heat from the superconducting magnet to the gaseous helium in the thermal conductive tubing;
allowing the gaseous helium from the thermally conductive cylinder to rise by thermal gradients to the cooling column and up the cooling column to the coldhead to be recondensed to the liquid state.

10. The method according to claim 9, wherein the gaseous helium sealed in the closed loop of thermally conductive tubing forms a thermosiphon which circulates the gaseous helium using thermal gradients without moving parts.

11. The method according to claim 10, further including:
quenching the superconducting magnet;
in response to the quenching, the superconducting magnet heating to at least 70° K which heats the first pool of helium to at least 70° K;
heating the liquid state and gaseous helium in the thermally conductive cylinder with the gaseous helium in the closed loop of thermally conductive tubing causing pressures of gaseous helium in the thermally conductive cylinder and the cooling column to rise;
with the rise in pressure, flowing the gaseous helium from the cooling column into the expansion tank without venting any of the gaseous helium to the atmosphere.

12. The method according to claim 11, further including:
continuing to cool the gaseous helium in the cooling column with the coldhead;
as the pressure in the cooling column drops due to the cooling, condensing the gaseous helium to the liquid state and allowing the liquid state helium to flow by gravity into the thermally conductive cylinder;
transferring heat from the gaseous helium sealed in the closed loop of thermally conductive tubing to the liquid state gaseous helium in the thermally conductive cylinder;
transferring heat from the superconducting magnet to the gaseous helium in the closed loop of thermally conductive tubing;
when sufficient heat is transferred from the superconducting magnet to reach its superconducting temperature, restarting the superconducting magnet.

13. A heat exchanging system comprising:
a hermetically sealed interconnected combination of a thermally conductive cylinder, a cooling column disposed higher than the thermally conductive cylinder and fluidically connected thereto, a coldhead mounted adjacent a top of the cooling column, and an expansion tank fluidically connected with the cooling column and the coldhead;
helium gas hermetically sealed in said hermetically sealed interconnected combination such that the helium gas cannot escape from the helium gas in the hermetically sealed interconnected combination of the thermally conductive cylinder, the cooling column, the coldhead, and the expansion tank;
a hermetically sealed closed loop of thermally conductive tubing containing gaseous helium, the closed loop of thermally conductive tubing being mounted in thermal communication with the thermally conductive cylinder to transfer heat to helium in the thermally conductive cylinder and being thermally connected with a superconducting magnet to receive heat from the superconducting magnet, the thermally conductive tubing forming a thermosiphon which circulates the gaseous helium using thermal gradients without moving parts.

14. The heat exchanging system according to claim 13, wherein the thermally conductive cylinder, the cooling column, the coldhead, and the expansion tank are fluidically interconnected such that as the coldhead condenses gaseous helium into liquid helium, the liquid helium flows by gravity down the cooling column and from a bottom of the cooling column to the thermally conductive cylinder and such that gaseous helium from the thermally conductive cylinder flows due to thermal gradients from the thermally conductive cylinder up to the cooling column and up to the coldhead.

15. The heat exchanging system according to claim 14, wherein the cooling cylinder and the expansion reservoir are fluidically connected such that helium freely flows between the cooling cylinder and the expansion tank to equalize helium pressures therein.

16. The heat exchanging system according to claim 13, wherein the thermally conductive cylinder is disposed with a longitudinal axis extending horizontally and further including:
a baffle plate disposed horizontally in the thermally conductive cylinder to divide an interior of the thermally conductive cylinder into a lower portion configured to receive liquid helium from the cooling column and an upper portion configured to supply gaseous helium to the cooling column.

17. The heat exchanging system according to claim 16, wherein the thermally conductive cylinder further includes:

an inflow port defined below the baffle plate and fluidically connected with a lower portion of the cooling column by a liquid helium line such that liquid helium flows by gravity from the lower portion of the cooling column through the liquid helium line into the thermally conductive cylinder via the inflow port; and an outflow port disposed in the thermally conductive cylinder above the baffle plate and fluidically connected with the cooling column by a gaseous helium line, the gaseous helium line being connected with the cooling column higher than the liquid helium line, such that thermal gradient cause gaseous helium which has absorbed heat from the hermetically sealed loop of tubing to rise through the inflow tube via the outflow port and the gaseous helium line into the cooling cylinder.

18. The heat exchanging system according to claim 13, wherein the thermally conductive tubing is wrapped around the thermally conductive cylinder and in the thermal communication therewith such that a portion of the tubing through which warmed gaseous helium rises is thermally connected to the thermally conductive cylinder higher than a portion of the tubing thermally connected to the thermally conductive cylinder leads to the superconducting magnet.

19. The heat exchanging system according to claim 13, further including:

a plurality of thermally conductive disks thermally connected to an exterior of the thermally conductive cylinder and extending therefrom and wherein the thermally conductive tubing is mounted to the thermally conductive disks in a spiral pattern such that the thermally conductive tubing is thermally connected with the thermally conductive cylinder via the thermally conductive disks.

20. The heat exchanging system according to claim 19, wherein the thermally conductive tubing spirals radially inward on the thermal conductive disks such that the gaseous helium in the thermally conductive tubing flows spirally from an outer radial portion of the thermally conductive disk to an inner radial portion of the thermally conductive disk as heat is transferred from the gaseous helium in the tubing to the helium in the thermally conductive cylinder.

* * * * *